United States Patent [19]

Prohaska et al.

[11] Patent Number: 4,933,060
[45] Date of Patent: Jun. 12, 1990

[54] SURFACE MODIFICATION OF FLUOROPOLYMERS BY REACTIVE GAS PLASMAS

[75] Inventors: George W. Prohaska, Willoughby; Richard J. Butler, Euclid; Carl G. Nickoson, Shaker Heights, all of Ohio

[73] Assignee: The Standard Oil Company, Cleveland, Ohio

[21] Appl. No.: 152,124

[22] Filed: Feb. 4, 1988

Related U.S. Application Data

[63] Continuation of Ser. No. 20,844, Mar. 2, 1987, abandoned.

[51] Int. Cl.$^5$ .............................................. C23C 14/34
[52] U.S. Cl. .............................. 204/192.36; 156/643
[58] Field of Search .................. 204/168, 169, 192.36; 156/643

[56] References Cited

U.S. PATENT DOCUMENTS

| | | | |
|---|---|---|---|
| 3,030,290 | 4/1962 | Ryan | 204/169 |
| 3,069,286 | 12/1962 | Hall | 204/169 |
| 3,288,638 | 11/1966 | Van Paassen et al. | 204/165 |
| 3,323,947 | 6/1967 | Kahng et al. | 117/213 |
| 3,455,774 | 7/1969 | Lindsey et al. | 161/189 |
| 3,477,902 | 11/1969 | Tomasino et al. | 427/38 |
| 4,064,030 | 12/1977 | Nakai et al. | 204/192.36 |
| 4,252,848 | 2/1981 | Datta et al. | 428/64 |
| 4,364,970 | 12/1982 | Imada et al. | 204/169 |
| 4,430,151 | 2/1984 | Tsukada | 156/626 |
| 4,430,361 | 2/1984 | Robinson et al. | 427/39 |
| 4,548,867 | 10/1985 | Veno et al. | 428/409 |
| 4,549,921 | 10/1985 | Wolfe, Jr. | 156/272.6 |
| 4,608,282 | 8/1986 | Runge | 427/385.5 |
| 4,680,086 | 7/1987 | Thomas et al. | 156/643 |
| 4,804,431 | 2/1989 | Ribner | 204/192.36 |

OTHER PUBLICATIONS

Melliar-Smith et al., "Thin Film Processes" Vossen and Kern Academic Press, New York, pp. 500-513, (1978).

*Primary Examiner*—John F. Niebling
*Assistant Examiner*—Steven P. Marquis
*Attorney, Agent, or Firm*—Larry W. Evans; Joseph G. Curatolo; Teresan W. Gilbert

[57] ABSTRACT

A method to modify the surface or fluoropolymer by a reactive gas plasma so that the surfaces have improved fluoropolymer to other substrate adhesive bond strength.

16 Claims, No Drawings

SURFACE MODIFICATION OF FLUOROPOLYMERS BY REACTIVE GAS PLASMAS

This is a continuation of co-pending application Ser. No. 020,844 filed Mar. 2, 1987, now abandoned.

BACKGROUND

The present invention is directed generally to the modification of the surface of fluoropolymer sheet materials by a reactive gas plasma process. In another aspect the present invention relates to a method to treat the surface of fluoropolymers with a reactive gas plasma to improve the bonding of fluoropolymers to other substrates without the use of adhesives. In another aspect the present invention relates to a method to treat the surface of fluoropolymers with a reactive gas plasma to improve the bonding of fluoropolymers to metals with the use of adhesives.

There is a need to modify fluoropolymer surfaces so that there is good adhesive bonding of the surface of a fluoropolymer substrate such as film or sheet to substrates such as metals, plastics including fiber reinforced plastics and ceramics. Fluoropolymers are inert, therefore, there is a need to discover processes which bond the surface of a fluoropolymer sheets or films to other substrates. Bonding of fluoropolymer sheet material to other substrates has been accomplished by many different approaches.

The major commercial method of promoting the adhesion of fluoropolymer surfaces to metal surfaces is the alkali metal treatment, wherein sodium and/or potassium metal is reacted with naphthalene/THF or liquid ammonia to produce the treatment salution, see W. M. Riggs & D. W. Dwight, J. Electron Spectros Rel. Phen., 5, 447 (1974), and C. V. Cagle, Adhesive Bonding Techniques and Applications, McGraw Hill, New York. The disadvantages of this approach are that there is a low level of defluorination achieved, the surface degrades easily and there are waste disposal problems.

Another approach for modifying the fluoropolymer surface is the ion bombardment process whereby the surface to be bonded is exposed to a flux of particles of radiation whereby the ions induce a physical change and thereby modify the surface. The radiation roughens the fluoropolymer surface allowing for adherence to the metal surface. The disadvantages of these approaches are that there is shallow depth of treatment, partial defluorination and the creation of unsaturated sites.

Reactive gases plasmas, of hydrogen, oxygen, helium-oxygen, and nitrogen plasmas have been used to treat the surfaces of polypropylene, see D. T. Clark and R. Wilson, J. Polymer Science, Polymer Chem. Edition, 2, 837 (1983), and D. S. Everhart and C. N. Reilley, Surf. Interface Anal., 3, 126 (1981). In accordance with this invention, it has been discovered that the treatment of fluoropolymer surfaces with reactive gas plasma of water, volatile non-polymerizing alcohols and volatile non-polymerizing organic acids renders the fluoropolymer surface reactive, with excellent adhesive bonding properties and long term stability against the degradation of environmental factors such as ultraviolet light, water, air, sunlight and the like.

The use of the reactive plasma gas surface modification of fluoropolymers of this invention allows for uniform modification of the fluoropolymer surface, elimination of waste disposal, simplicity of approach, long term stability of the modified fluoropolymer and excellent fluoropolymer to substrate adhesive bond strength.

It is an object of this invention to provide a method to surface treat fluoropolymer substrates with a reactive gas plasma so as to improve and provide excellent adhesive bonds of the fluoropolymer to other substrates.

It is another object of this invention to prepare fluoropolymer composites without the use of adhesives.

It is another object of this invention to provide a reactive gas plasma surface modification of fluoropolymer process wherein the fluoropolymer surface is reactive to forming strong adhesive bonds to metal and the fluoropolymer surface is stabilized toward environmental degradation of the surface of the fluoropolymer.

These and other objects, together with the advantages over known methods shall become apparent from the specification that follows and are accomplished by the invention as hereinafter described and claimed.

SUMMARY OF THE INVENTION

We have found that the adhesive bonding properties of fluoropolymers are improved by employing a reactive gas plasma of water, volatile non-polymerizing alcohols and non-polymerizing organic acids etch process to the surface of a fluoropolymer.

The invention relates to a method of preparing a surface of a fluoropolymer substrate, in particular a sheet material comprising subjecting the surface of the fluoropolymer to a reactive gas plasma which causes a chemical etching of the fluoropolymer's surface. In accordance with this invention the fluoropolymer substrate is positioned in the vicinity of an anode in a low electric field region compared to being positioned near the cathode in a high electric field region so that the modification of the surface of the fluoropolymer is effected by the chemical nature of the plasma and not the physical effects of the energetic ion bombardment characteristic of the cathode glow.

The surface treated fluoropolymer substrate can be used for liners, roll covers, coatings, electronic circuit boards, optical waveguides, packaging materials and electromagnetic interference shielding.

DETAILED DESCRIPTION OF THE INVENTION

The reactive gas plasma surface modification method of the instant invention produces a bondable fluoropolymer surface that has improved properties, in particular they are highly adherent to thin metal films.

The fluoropolymers suitable for use in this invention are in sheet form. One or both surfaces of a fluoropolymer can be modified by this method.

The fluoropolymers employed are any polymer which contains fluorine as an appended group. Typical fluoropolymers include but are not limited to homologues and derivatives of polytetrafluoroethylene, fluorinated ethylene-propylene copolymers, tetrafluoroethylene, PFA-perfluoroalkoxy resin, modified copolymer of ethylene and tetrafluoroethylene and the like. Most preferred are polytetrafluoroethylene and fluorinated ethylene-propylene copolymers.

Other exemplary fluoropolymers are those polymers prepared from perfluorinated α-fluoroolefin monomers containing hydrogen atoms as well as fluorine atoms. The α-fluoroolefin has 2 to 6 carbon atoms. Typical α-fluoroolefins include but are not limited to perfluorinated α-fluoroolefins such as tetrafluoroethylene, hexafluoropropene, perfluorobutene-1, perfluoroisobutene and the like, and hydrogen containing α-fluoroolefins such as trifluoroethylene, vinylidene fluoride, vinyl fluoride, pentafluoropropane and the like, and halogen containing α-fluoroolefins such as trifluorochloroethylene, 1, 1-difluoro-2,2 dischloroethylene, 1, 2-difluoro-1, 2 dischloroethylene, trifluorobromoethylene and the like, and perfluoroalkoxyethylene polymers.

The surface modification of the fluoropolymers is effected by a chemical reaction of the fluoropolymers with a reactive gas plasma. The reactive gas plasma can be employed using a single gas or a combination of gases. The reactive gas plasma can be generated from liquids, solids and/or gases. Typical reactive gases include but are not limited to water, volatile non-polymerizing alcohols, non-polymerizing organic acids and the like Most preferred is water. The reactive plasma gas does not include hydrogen, oxygen, nitrogen, helium-oxygen or inert gases. However, hydrogen and oxygen gases with a ratio of 2 hydrogen to 1 oxygen are within the scope of this invention.

The reactive gas process can be carried out in a plasma reactor, for illustration purposes a suitable reactor for carrying out the reactive gas plasma modification process is as follows: The reactor includes a vacuum chamber in a containment vessel such as a stainless steel or glass bell jar. In the vacuum chamber are two electrodes which can be screen, coil or plate material that has good electrical conductivity such as stainless steel, platinum, graphite or the like.

One electrode, that is the anode, is grounded and the other electrode, that is the cathode, is connected to an external power supply which may be either DC or AC current, so that there exists a voltage potential, from about 0.5 volts to about 1000 volts, preferably 10 volts to 300 volts between the electrodes with an alternating current from about 150 kHz to 2 GHz, preferably about 1 MHz to about 50 MHz. The interelectrode gap is from about 1/4 inch to about 2 feet and preferably from about 1 inch to about 5 inches.

The vacuum chamber has an inlet opening to allow the gas to enter into the vacuum chamber. An outlet on the vacuum chamber allows for the evacuation of the vacuum chamber by being connected to a mechanism such as a pump to remove the gas plasma.

In carrying out the surface modification of the fluoropolymer, the fluoropolymer sheet material is placed on the anode. The vacuum chamber is then evacuated to a pressure of about $10^3$ torr to about $10^{10}$ torr. The gas enters the inlet at a partial pressure of greater than about 1 mill torr up to about 10 torr. The gas becomes a plasma by employing a voltage to cause an electrical breakdown of the gas state to a plasma state. A plasma of the reactive gas is initiated between the electrodes by energizing the power source from about 10 watts to about 10 kwatts. The chemical etching reaction, that is the discharge duration, is generally from about 1 min. to about 20 mins. depending on the power, pressure and desired extent of chemical etching. The reactive gas plasma modifies the fluoropolymer surface by the chemical reaction of the plasma with the fluoropolymer surfaces and not from the electrical field created by ion bombardment of high energy particle in the region of the cathode After the chemical etching reaction, the discharge is extinguished by turning off the power supply and the vacuum chamber is evacuated to a base vacuum of about $10^3$ torr to about $10^{10}$ torr. The vacuum chamber is brought up to atmospheric pressure by bleeding nitrogen gas into an inlet. The treated fluoropolymers can then be stored with or without a protective covering such as aluminum foil and placing them on a shelf or in a controlled atmosphere such as a dry box.

The surface modified fluoropolymers have improved adhesive qualities to bond them onto other substrates such as metals, plastics, ceramics and the like The surface modified fluoropolymers can be bonded onto metals without an adhesive by deposition/evaportion of metals onto the modified fluoropolyer surface. Typical evaportion/deposition methods include but are not limited to thermal evaporation, electron beam evaporation, electroless deposition and the like.

The surface modified fluoropolymers can be bonded onto plastics with an adhesive by ultraviolet curing of the adhesive on the modified fluoropolymer surface. Adhesives can be used when metals, plastics and ceramic are laminated onto the modified fluoropolymer surface. Typical methods of forming a laminate of the modified fluoropolymer onto substrates is through an intermediate layer of a radiation curable composition of an adhesive. Upon irradiation of the product from a radiation source such as a ultraviolet lamp, electron beam apparatus or the like, this intermediate layer is cured and becomes bonded to the substrate and the modified fluoropolymer substrate. Intermediate layers of adhesives typically include but are not limited to epoxies, acrylates, urethanes and the like.

It is believed that when the fluoropolymers are subjected to the reactive gas plasma the plasma renders the surface hydrophillic by the concomitant defluorination and oxidation of the surface. This affects and modifies the surface of the fluoropolymer chemically, in that the surface becomes more reactive by the replacement of fluorine at the surface of the fluoropolymer with oxygen containing functionality groups that are more labile than fluorine and thus the fluropolymer surface has improved capability of forming adhesive bonds and stability against environmental degradation.

The modified fluoropolymers of the present invention have excellent fluoropolymer to metal adhesive bond strength. Further, the reactive gas plasma method employed to produce the fluoropolymer metal composites reduces chemical hazards and liquid waste disposal concerns, and requires less labor than the present commercial processes.

SPECIFIC EMBODIMENTS

The following examples further illustrate the present invention. These embodiments are presented by way of example and not by way of limitation of the scope of this invention. Further, it is understood that variations and modifications can be made by one skilled in the art without departing from the spirit and scope of the invention.

PLASMA REACTOR

The plasma reactor used to modify the fluoropolymer surfaces had a parallel-plate diode configuration. The plasma reactor system is essentially a containment chamber containing a vacuum chamber and electrodes attached to a power supply for initiating a plasma state of the reactive gas.

Two electrodes were placed in the stainless steel bell jar reactor, one was a lower grounded anode made of stainless steel and about six inches in diameter and the other was an upper cathode made of stainless steel, about 5 inches in diameter connected to about a 13.56 MHz external power supply. The inter-electrode gap was about 1 inch.

The stainless steel bell jar reactor had a volume of about 54 liters which was connected by molecular sieve traps to a mechanical pump and had a base vacuum about $10^{-4}$ torr. The stainless steel bell jar reactor had a vial attached to the inlet which held liquid water which evaporated into the reactor as the water vapor feed gas. A flow controller attached to the vial controlled the delivery rate of feed gas into a plasma The reaction pressure was established and maintained by an automatic throttle plate located between the reactor and the pump.

PLASMA REACTION PROCEDURE

The fluoropolymer sheet samples were wiped with acetone and then methanol prior to being placed in the reaction chamber The sample was then placed on the anode in the plasma diode configuration and then the reaction chamber was evacuated to a base vacuum of about $10^{-4}$ torr. Water vapor was introduced into the flow controller appended to the reaction chamber at about 200 mtorr for samples 1-6, 11-16 and 100 mtorr for samples 7-10, 17-24 by opening the water vial to the reaction chamber The reaction pressure was maintained at about 100 m torr to about 200 m torr for samples 1-6, 11-16 and about 140 m torr for samples 7-10, 17-24. The water vapor flow rate for samples 7-10, 17-24 was about 40 scc.

Comparative samples G,H employed oxygen plasma gas as the etching plasma gas using about 200m torr pressure, about 40 sccm of oxygen flow rate and about 70 watts power for about 30 min.

A plasma was then ignited by turning on the cathode power and the power level was adjusted to the desired level of about 70 watts to about 140 watts for samples 1-6, 11-16 and about 20 watts to about 200 watts for samples 7-10, 17-24. The chemical etching reaction duration was for about 5 min to about 20 min. for samples 1-6, 11-16 and about 1 min. to about 20 mins. for samples 7-10, 17-24 The discharge was then extinguished and the reactor was evacuated to a base vacuum of about $10^{-4}$ torr. The reactor was brought up to atmospheric pressure with nitrogen and the treated samples were removed and stored at room temperature.

FLUOROPOLYMER COMPOSITION

Sample 1-6, 11-16, A-D, G-H were fluorinated ethylenepropylene copolymer sheets.

Sample 7-10, E-F, 17-24 were polytetrafluoroethylene sheets.

DEPOSITION PROCEDURE

Metal films were deposited onto the etched fluoropolymer samples 17-24. The thickness of the metal films were from about 1000A to about 1.5 microns. The metals employed for the deposition of the etched fluoropolymer samples were as follows

| Sample # | Metals |
| --- | --- |
| 17 | Gold |
| 18 | Copper |
| 19 | Nickel |
| 20 | Aluminum |
| 21 | Chromium |
| 22 | Molybdenum |

-continued

| Sample # | Metals |
| --- | --- |
| 23 | Silver |
| 24 | Platinum |

Gold was deposited on the fluoropolymer samples by thermal evaporation, that is, in a vacuum chamber the metal was heated until it volatized and then deposited onto the fluoropolymer surface. All the other metals were deposited on the fluoropolymer samples by electron beam evaporation that is, the metal was bombarded with energetic electrons till the metal volatized and then deposited onto the fluoropolymer surface.

SODIUM NAPTHALIDE PROCEDURE

Comparative samples C-D of fluorinated ethylene-propylene copolymer were etched by the sodium napthalide procedure as follows.

The samples were wiped with acetone and then abraded lightly with about 200 grit emery paper. The samples were then immersed in a solution of about 46 g of sodium metal, about 128 g of napthalene and about 1 g tetrahydrofuran for about 10 sec to about 1 1/2 minutes at room temperature. The samples were removed from the etching solution and neutralized by wiping with isopropyl alcohol. The samples were then rinsed with distilled water and dried at about 100° F. to 120° F. The etched samples were light to dark brown The results are found in Table I.

SURFACE ANALYSIS

Surface analysis was performed by x-ray photoelectron spectroscopy using a Kratos XSAM 800, on samples 1-6 and A-D to determine the chemical composition of the etched surface. Samples A&B were virgin fluorinated ethylene-propylene copolymer sheets. Samples C&D were fluorinated ethylene-propylene copolymer sheets etched by the sodium napthalide procedure. The results are found in Table I.

X-ray photoelectron spectroscopy, Kratos XSAM 800 was used to analyze the surfaces and chemical structures of samples 7-10, and E and F. The results are found in Table II.

ADHESION PROCEDURES

Etched fluoropolymer samples 11-16, G, H and 17-24 were applied to an epoxy-based coating on metal, by photocuring the fluoropolymer-epoxy composition with UV light using a mercury arc lamp operated at about 200 watts/inch at about a line speed of about 30 feet/minute. The adhesion tape test (ASTM - D3359-78) was carried out on these samples.

The adhesion tape test (ASTM D3359-78) was carried out by applying a strip of Scotch Brand No. 670 tape (3M) to a cross-cut section previously made by a sharp tool in the coated substrate. The tape was then removed The percent adhesion, of coating remaining on the substrate, was assessed of a 0-100 scale with no adhesion being 0 and 100 percent adhesion being no loss of coating. The results are found in Table III and IV.

RESULTS

The surface analysis results demonstrate that the water plasma chemical etch process is more effective in removing surface fluorine and in replacing the surface fluorine with oxygen compared to the sodium napthalide process and the virgin fluoropolymer. Accordingly, the water plasma reaction process leads to improved adhesive bond formation.

The adhesion tape test results demonstrate that the fluoropolymer epoxy compositions had 32% to 100% adhesion for those prepared by the water plasma chemical etch reaction of the instant invention. The adhesion test tape of polytetrafluoroethylene metal composites showed 100% adhesion. Accordingly, the modification of surfaces of fluoropolymer by a water vapor reactive gas plasma process have excellent adhesive bonding characteristics.

TABLE I

SURFACE ANALYSIS OF FLUORINATED ETHYLENE-PROPYLENE COPOLYMERS

| SAMPLE # | NET POWER (W) | ETCH TIME (MIN.) | CARBON (%) | OXYGEN % | FLUORINE (%) |
|---|---|---|---|---|---|
| 1 | 140 | 5 | 54.5 | 9.4 | 36.1 |
| 2 | 140 | 10 | 55.3 | 10.1 | 34.6 |
| 3 | 140 | 20 | 57.1 | 9.5 | 33.4 |
| 4 | 70 | 5 | 52.9 | 6.8 | 40.3 |
| 5 | 70 | 10 | 52.7 | 6.7 | 40.5 |
| 6 | 70 | 20 | 56.8 | 5.2 | 38.0 |
| A Virgin FEP | — | — | 41.9 | 1.4 | 56.7 |
| B Virgin FEP | — | — | 42.5 | 0.4 | 57.1 |
| C Sod. Nap. FEP | — | — | 48.4 | 1.1 | 50.5 |
| D Sod. Nap. FEP | — | — | 50.3 | 1.7 | 48.0 |

TABLE II

SURFACE ANALYSIS OF POLYTETRAFLUOROETHYLENE

| SAMPLE # | ETCH TIME (MIN.) | CARBON (%) | OXYGEN (%) | FLUORINE (%) |
|---|---|---|---|---|
| 7 | 20 | 26.0 | 15.0 | 58.0 |
| 8 | 15 | 42.3 | 11.2 | 46.6 |
| 9 | 10 | 43.8 | 10.5 | 45.7 |
| 10 | 6 | 39.6 | 12.3 | 48.1 |
| E Virgin PTFE | — | 29.0 | 0.7 | 70.0 |
| F Virgin PTFE | — | 38.1 | 0.8 | 61.1 |

TABLE III

ADHESION TAPE TEST ON FLUORINATED ETHYLENE-PROPYLENE COPOLYMER EPOXY BASED COATING

| SAMPLE # | PLASMA GAS | NET POWER (W) | ETCH TIME (MIN.) | ADHESION (%) |
|---|---|---|---|---|
| 11 | WATER | 70 | 5 | 32 |
| 12 | WATER | 70 | 10 | 100 |
| 13 | WATER | 70 | 20 | 100 |
| 14 | WATER | 140 | 5 | 100 |
| 15 | WATER | 140 | 10 | 100 |
| 16 | WATER | 140 | 20 | 100 |
| G | OXYGEN | 70 | 30 | 0 |
| H | OXYGEN | 70 | 30 | 0 |

TABLE IV

ADHESION TAPE TEST ON POLYTETRAFLUOROETHYLENE METAL COMPOSITES

| SAMPLE # | METAL | PLASMA GAS | NET POWER (Watts) | ETCH TIME (MIN.) | ADHESION (%) |
|---|---|---|---|---|---|
| 17 | GOLD | Water Vapor | 180 | 20 | 100 |
| 18 | COPPER | Water Vapor | 180 | 20 | 100 |
| 19 | NICKEL | Water Vapor | 180 | 20 | 100 |
| 20 | ALUMINUM | Water Vapor | 180 | 20 | 100 |
| 21 | CHROMIUM | Water Vapor | 180 | 20 | 100 |
| 22 | MOLYBDENUM | Water Vapor | 180 | 20 | 100 |
| 23 | SILVER | Water Vapor | 180 | 20 | 100 |
| 24 | PLATINUM | Water Vapor | 180 | 20 | 100 |

We claim:

1. A process for the surface modification of a fluoropolymer sheet material in a vacuum chamber having an anode and a cathode comprising subjecting said fluoropolymer to a reactive gas plasma comprising water wherein said fluoropolymer is in contact with said anode and further wherein said reactive gas plasma is initiated by evacuating the vacuum chamber to a pressure of about $10^{-4}$ Torr to about $10^{-10}$ Torr and applying a voltage of about 0.5 volts to about 1000 volts with an alternating current of 1 MHz to 2 GHz such that the net power is about 10 watts to about 10 kilowatts power between the cathode and the anode wherein the cathode area is about 20 sq. in. and the anode area is about 29 sq. in. for about 1 minute to about 60 minutes to reactive plasma etch the fluoropolymer in the anode region.

2. The process of claim 1 wherein the fluoropolymer is selected from the group consisting of polytetrafluoroethylene, fluorinated ethylene-proprolyene copolymers, tetrafluoroethylene, PFA-perfoluoroalkoxy resin, modified copolymer ethylene and tetrafluroethylene and combinations thereof.

3. The process of claim 1 wherein the fluoropolymer is selected from the group consisting of polytetrafluroethylene, fluorinated ethylene-propylene copolymers and combinations thereof.

4. The process of claim 1 wherein the fluoropolymer is selected from the group consisting of hexafluoropropene, perfluorobutene -1, perfluoroisobutene, trifluoroethylene, vinylidene fluoride, vinyl fluoride, pentafluoropropane, trifluorocnloroethylene, 1,1-difluoro-2,2 1,2-difluoro-1,2 dischloroethylene, trifluorobromoethylene and combinations thereof.

5. The process of claim 1 wherein said treatment time is from about 1½minutes to about 20 minutes.

6. The process of claim 1 wherein said Voltage is from about 10 volts to about 300 volts.

7. The process of claim 1 wherein said alternating current is from about 1[MgHz] MHz to 50 [MgHz] MHz.

8. The process of claim 1 wherein the interelectrode gap is from about 1 quarter inch to about 2 feet.

9. The process of claim 8 wherein the interelectrode gap is from about 1 inch to about 5 inches.

10. The process of claim 1 wherein the surface modified fluoropolymer is bonded onto a substrate selected from the group consisting of metals, plastics and ceramics.

11. The process of claim 10 wherein the fluoropolymer can be bonded onto metal.

12. The process of claim 1 wherein the surface fluoropolymers is bonded onto metals without the use of adhesives.

13. The process of claim 1 wherein said reactive gas plasma renders the surface of said fluoropolymer sheet material hydrophillic by the concomitant defluorination and oxidization of said surface.

14. The process of claim 13 wherein fluorine atoms located on or near the surface of said fluoropolymer are replaced with oxygen containing functionality groups supplied from said reactive gas plasma.

15. A process for the surface modification of a fluoropolymer sheet material comprising subjecting said fluoropolymer to a reactive gas plasma, selected from the group consisting of water, volatile non-polymerizing alcohols, non-polymerizing organic acids and combination thereof, wherein said fluoropolymer is in a containment vessel containing a vacuum chamber containing an anode and a cathode, and wherein said fluoropolymer is in contact with said mode and further wherein said reactive gas plasma is initiated by evacuating the vacuum chamber to a pressure of about $10^{-3}$ Torr to about $10^{-10}$ Torr and applying a voltage of about 0.5 volts to about 1000 volts with an alternating current of about I50 kHz to about 2 GHz such that the net power generated is about 10 watts to about 10 kilowatts of power between the cathode and the anode wherein the cathode area and further wherein the treatment time is about 1 minute to about 60 minutes reactive plasma etch the fluoropolymer in the anode region.

16. A process for the surface modification of a fluoropolymer sheet material comprising subjecting said fluoropolymer to reactive gas plasma comprising water and wherein said fluoropolymer is in a containment vessel containing a vacuum chamber containing an anode and a cathode, and wherein said fluoropolymer is in contact with said mode and further wherein said reactive gas plasma is initiated by evacuating the vacuum chamber to a pressure of about $10^{-3}$ Torr to about $10^{-10}$ Torr and applying a voltage of about 0.5 volts to about 1000 volts with an alternating current of about 150 kHz to about 2 GHz such that the net power generated is about 10 watts to about 10 kilowatts of power between the cathode and the anode wherein the cathode area is about 20 sq. in. and the aode area is about 29 sq. in. and further wherein the treatment time is about 1 minute of about 60 minutes reactive plasma etch the fluoropolymer in the anode region and wherein the fluoropolymer is bonded onto metal without the use of adhesives.

* * * * *